US006842975B2

(12) United States Patent
Revel et al.

(10) Patent No.: US 6,842,975 B2
(45) Date of Patent: Jan. 18, 2005

(54) METHOD AND EQUIPMENT FOR EQUIPPING PLUG HOUSINGS WITH FITTED-OUT CABLE ENDS OF A CABLE

(75) Inventors: Jean Revel, Pourrière (FR); Claudio Meisser, Cham (CH)

(73) Assignee: Komax Holding AG, Dierikon (CH)

(*) Notice: Subject to any disclaimer, the term of this patent is extended or adjusted under 35 U.S.C. 154(b) by 54 days.

(21) Appl. No.: 10/265,989

(22) Filed: Oct. 7, 2002

(65) Prior Publication Data

US 2003/0066190 A1 Apr. 10, 2003

(30) Foreign Application Priority Data

Oct. 5, 2001 (EP) .......................................... 01810974

(51) Int. Cl.[7] .................................................. H05K 3/00

(52) U.S. Cl. ............................. 29/842; 29/825; 29/845

(58) Field of Search .......................... 29/747, 753, 825, 29/842, 845, 854, 857, 837, 868

(56) References Cited

U.S. PATENT DOCUMENTS 4,658,503 A * 4/1987 Eaton .......................... 29/854
4,757,606 A * 7/1988 Eaton .......................... 29/748
4,967,470 A * 11/1990 Folk ............................ 29/747
5,083,370 A * 1/1992 Koch et al. .................... 29/863
5,127,159 A 7/1992 Kudo et al.
5,157,830 A * 10/1992 Koch .......................... 29/857
5,485,660 A * 1/1996 Pittau .......................... 29/718
6,038,763 A 3/2000 Kodera et al.

FOREIGN PATENT DOCUMENTS

EP 0 716 482 6/1996

* cited by examiner

*Primary Examiner*—Carl J. Arbes
(74) *Attorney, Agent, or Firm*—MacMillan, Sobanski & Todd, LLC

(57) ABSTRACT

An equipping installation introduces fitted-out cable ends into plug housings and is arranged downstream from a fitting-out installation. A contact for the first plug housing is arranged at the leading cable end and a contact for the second plug housing is arranged at the trailing cable end. A feeder unit takes over the cable loop fitted-out to a finished state from a second transfer unit and transfers the leading cable end to a positioning unit and the trailing cable end either to a rotatable store or, after the positioning unit is again free of cable, to the positioning unit in accordance with a cable plan. An equipping unit takes over the cable ends in succession at the positioning unit and introduces the cable ends into the corresponding plug housings.

9 Claims, 12 Drawing Sheets

METHOD AND EQUIPMENT FOR EQUIPPING PLUG HOUSINGS WITH FITTED-OUT CABLE ENDS OF A CABLE

BACKGROUND OF THE INVENTION

The present invention relates to a method and equipment for equipping plug housings with fitted-out cable ends of a cable, wherein an equipping unit introduces the cable ends into cells of the plug housing.

An equipping installation, which is arranged downstream of a fitting-out installation and which introduces the fitted-out cable ends in finished state into a first plug housing or into a second plug housing, is shown in the European patent application EP 0 181 0355.6. A contact for the first plug housing is arranged at the leading cable end and a contact for the second plug housing is arranged at the trailing cable end. A feeder unit takes over from a second transfer unit the cable loop fitted-out to a finished state and transfers the leading cable end to a second transfer station and the trailing cable end either to a rotatable store or, after the second transfer station is again free of cable, to the second transfer station in accordance with the respective cable plan. An equipping unit takes over the cable ends in succession at the second transfer station and introduces the cable ends into the corresponding plug housing.

A disadvantage of this known equipment is that contacts at the cable ends twisted about the longitudinal axis of the cable are difficult to introduce into the plug housing or even cannot be introduced at all. In the case of contacts with, for example, rectangular cross-section that fit into plug housings with rectangular cells, the contacts must be equipped without being in a twisted state.

SUMMARY OF THE INVENTION

The present invention creates a remedy for the disadvantage of the known equipment and provides an equipping apparatus which enables equipping of plug housings independently of a twisted state of the contacts.

The advantages achieved by the present invention are essentially to be seen in that the twist caused by the cable construction and thus the tendency for rotation of the fitted-out cable end about the cable longitudinal axis can be corrected during the equipping of plug housings. Improperly equipped plug housings, particularly in the case of contacts of rectangular cross-section and rectangular housing cells, can be avoided by the equipment according to the present invention. Moreover, the contact can be introduced more quickly into the housing cell, because each contact is precisely pre-positioned.

DESCRIPTION OF THE DRAWINGS

The above, as well as other advantages of the present invention, will become readily apparent to those skilled in the art from the following detailed description of a preferred embodiment when considered in the light of the accompanying drawings in which.

DESCRIPTION OF THE PREFERRED EMBODIMENT

Figure 1:
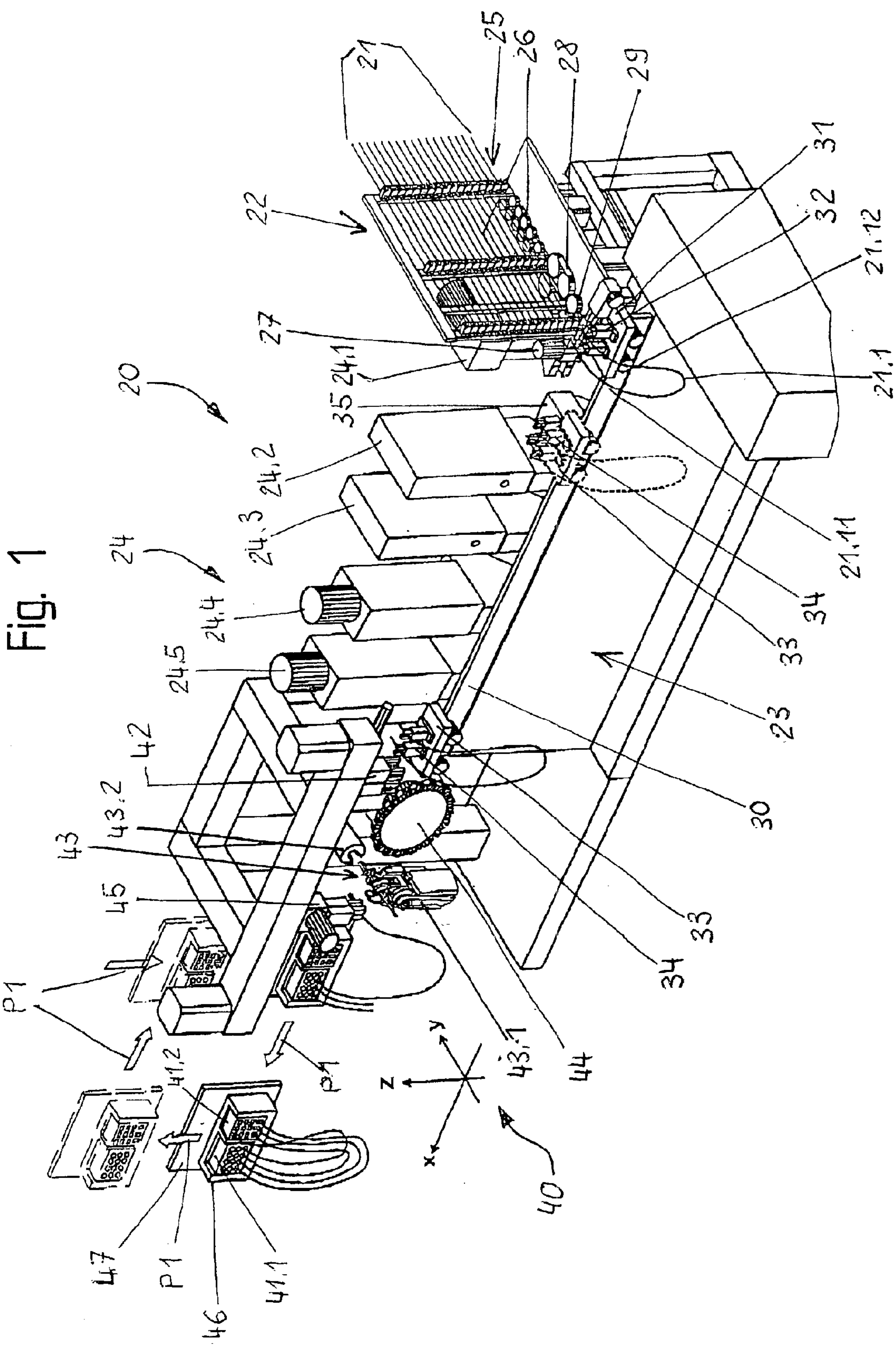
FIG. 1 is a perspective view of a fitting-out installation with a downstream equipping installation apparatus in accordance with the present invention.

FIG. 1 shows a fitting-out installation 20 for cables 21, which includes a cable unit 22, a cable feeder 23 and a plurality of fitting-out units 24. As the fitting-out units 24 there are provided, for example, an insulation-stripping station 24.1, a pair of bushing stations 24.2 and 24.3 and/or a pair of crimping stations 24.4 and 24.5. Further and/or other forms of fitting-out stations are also possible. A plurality of the cables 21, which can be of different cross-sections, colors and construction, are held in a cable changer 25 adjustable in height. The term “cables” means cables or conductors, including optical conductors, differing in matters of construction, diameter and color. The cable type to be fitted-out is brought into a straightening path 26 by adjustment of the cable changer 25 in height. A leading cable end 21.11 is gripped by a loop-laying device 27 and turned horizontally through 180 degrees. At the same time, the cable 21 is advanced by means of a cable advancing device 28 and straightened by means of the straightening path 26. An encoder 29 measures the length of the advanced cable 21, wherein a cable loop 21.1 is formed during the advancing. The cable feeder 23 consists of a first transfer unit 31, which is displaceable along a transfer guide 30, with a first gripper unit 32 and of a second transfer unit 33, which is displaceable along the transfer guide 30, with a second gripper unit 34. A first drive, which moves the first transfer unit 31 along the transfer guide 30, is not illustrated. A second drive, which moves the second drive unit 33 along the transfer guide 30, is not illustrated. The first or second drive can be, for example, a stepping motor that linearly drives the transfer units 31 or 33 by means of a first cogged belt or a second cogged belt. As a variant form, the drive can also be, for example, a linear drive with a linear motor.

The direction of the movement of the transfer units 31 and 33 is denoted by a direction arrow X. The movement directions of the gripper units 32 and 34 are denoted by a direction arrow Y and a direction arrow Z. A control device (not illustrated) controls and monitors the fitting-out installation 20, wherein the movements of, in particular, the transfer units 31 and 33 and the gripper units 32 and 34 are freely programmable. Moreover, the control device can, during control of the transfer units 31 and 33 and the gripper units 32 and 34, immediately adapt the movement of, in particular, the gripper units 32 and 34 in the Y direction to the cable diameter in the case of, for example, a change in the cable type to be fitted-out. A keyboard (not illustrated) and a display screen (not illustrated) serve as a man/machine interface. The first gripper unit 32 takes over one cable end, termed the leading cable end 21.11 in the following, of the cable loop 21.1 from the loop-laying device 27 and the other cable end, termed a trailing cable end 21.12 in the following, of the cable loop 21.1 from the cable changer 25. After cable cutting, the first transfer unit 31 moves to the insulation-stripping station 24.1 which removes the cable casing at the cable ends 21.11 and 21.12. After the insulation stripping process the first transfer unit 31 together with the cable loop 21.1 moves on to a first transfer station 35, transfers the cable loop 21.1 to this station and moves back to the starting position. The second transfer unit 33 takes over the cable loop 21.1 at the first transfer station 35 and brings the cable loop 21.1 to at least one of the bushing stations 24.2 and 24.3 and/or to at least one of the crimping stations 24.4 and 24.5. Thereafter the second transfer unit 33 together with the cable loop 21.1 fitted-out to finished state moves into the end position shown in FIG. 1 and waits or transfers the cable loop 21.1 to a further transfer station (not illustrated).

As shown in FIG. 1 an equipping installation 40 is arranged downstream of the fitting-out installation 20 and introduces the cable ends 21.11 and 21.12 fitted-out to a finished state into a first plug housing 41.1 and into a second plug housing 41.2, respectively. A contact for the first plug housing 41.1 is arranged at the leading cable end 21.11 and a contact for the second plug housing 41.2 is arranged at the trailing cable end 21.12. A feeder unit 42 takes over the cable loop 21.1 fitted-out to a finished state from the second transfer unit 33 or from the further transfer station and transfers the leading cable end 21.11 to a positioning unit 43 and the trailing cable end 21.12 either to a store 44, which is, for example, rotatable, or, after the positioning unit 43 is again free of cable, to the positioning unit 43 in accordance with a respective cable plan. An equipping unit 45 takes over the cable ends 21.11 and 21.12 in succession and positionally correct at the positioning unit 43 and introduces the cable ends 21.11 and 21.12 into the corresponding plug housings 41.1 and 41.2. The plug housings 41.1 and 41.2 are arranged in a housing holder 46 of a housing pallet 47. The housing pallet 47 executes a movement symbolized by arrows P1, wherein the equipping of the pallet 47 with the housings 41.1 and 41.2 and the removal of the equipped housings 41.1 and 41.2 can be carried out manually or automatically. The feeder unit 42, the store 44, the positioning unit 43, the equipping unit 45 and the plug housings 41.1 and 41.2 are arranged adjacent to one another or in a row. The plug housings 41,1 and 41.2 are laid in a like manner and are equipped with the cable ends 21.11 and 21.12 transported to be lying in like manner. The movement necessary in the z direction for equipping the housings 41.1 and 41.2 (movement for the next higher cell line) can be executed either by the equipping unit 45 or by the pallet 47.

Figure 2:
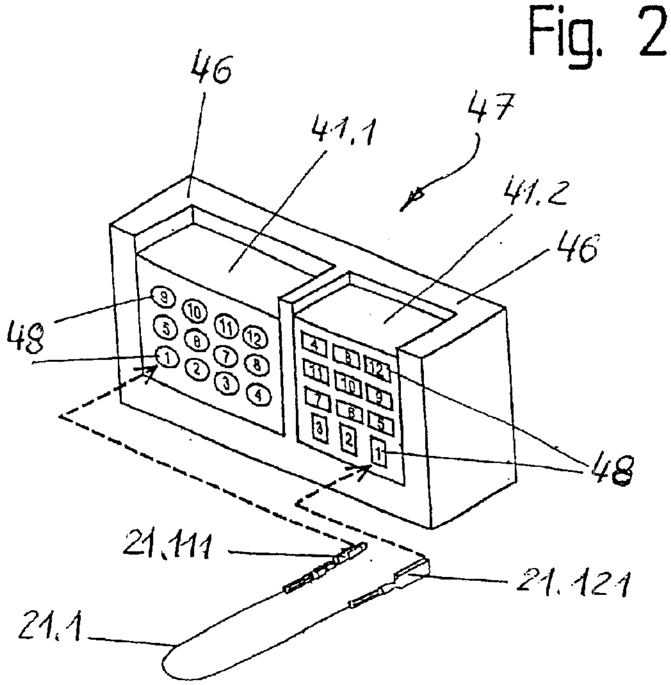
FIG. 2 is an example of a cable plan for the equipping of the pair of housings shown in FIG. 1.

FIG. 2 shows the first housing 41.1 and the second housing 41.2, wherein the housings have cells 48 for the reception of the contacts on the ends of the cables 21. So that the equipping unit 45 can be driven up to the cells 48 without obstruction, the lowermost cell line must firstly be equipped from left to right, then the next higher cell line from left to right and finally the uppermost cell line. FIG. 2 shows the cable plan or the cable sequence for the leading cable ends 21.11 of the cable loops 21.1, wherein the first housing 41.1 has twelve of the cells 48 for the reception of twelve of the leading cable ends 21.11 with, for example, in each case a respective contact sleeve 21.111 with a round cross-section. The cable movement sequence corresponds with the equipping sequence represented by numbers in the cells 48 beginning at the lower left and ending at the upper right. In the case of the second housing 41.2 for the reception of the trailing cable ends 21.12, the cable sequence no longer corresponds with the equipping sequence as, for example, firstly the trailing cable end 21.12 of the third cable loop 21.1 must be equipped, then the trailing cable end 21.12 of the second cable loop 21.1 and subsequently the trailing cable end 21.12 of the first cable loop 21.1. So that the above-mentioned equipping sequence is possible, the trailing cable ends 21.12, which, for example, are each provided with a respective cable lug 21.121 with rectangular cross-section, of the first and second cable loops 21.1 are intermediately stored in the store 44. The trailing cable end 21.12 of the third cable loop 21.1 can, from the viewpoint of the equipping sequence, be equipped without intermediate storage. After the trailing cable end 21.12 of the third cable loop 21.1, the trailing cable end 21.12 of the second cable loop 21.1 and then the trailing cable end 21.12 of the first cable loop 21.1 are introduced into the corresponding cells 48 in the second housing 41.2 in the lowermost cell line. An analogous equipping sequence results for the next higher cell line and the cell line above that, wherein the trailing cable ends 21.12 of the seventh and eleventh cable loops 21.1 are, from the viewpoint of the equipping sequence, equipped without intermediate storage and the trailing cable ends 21.12 of the remaining cable loops 21.1 are equipped in each case with intermediate storage. Still further plug housings can also be provided, which are interconnected by means of cable loops or are connected with the first or second plug housing, wherein the further plug housings are, with exception of the last plug housing, also to be equipped with leading cable ends.

Figure 3:
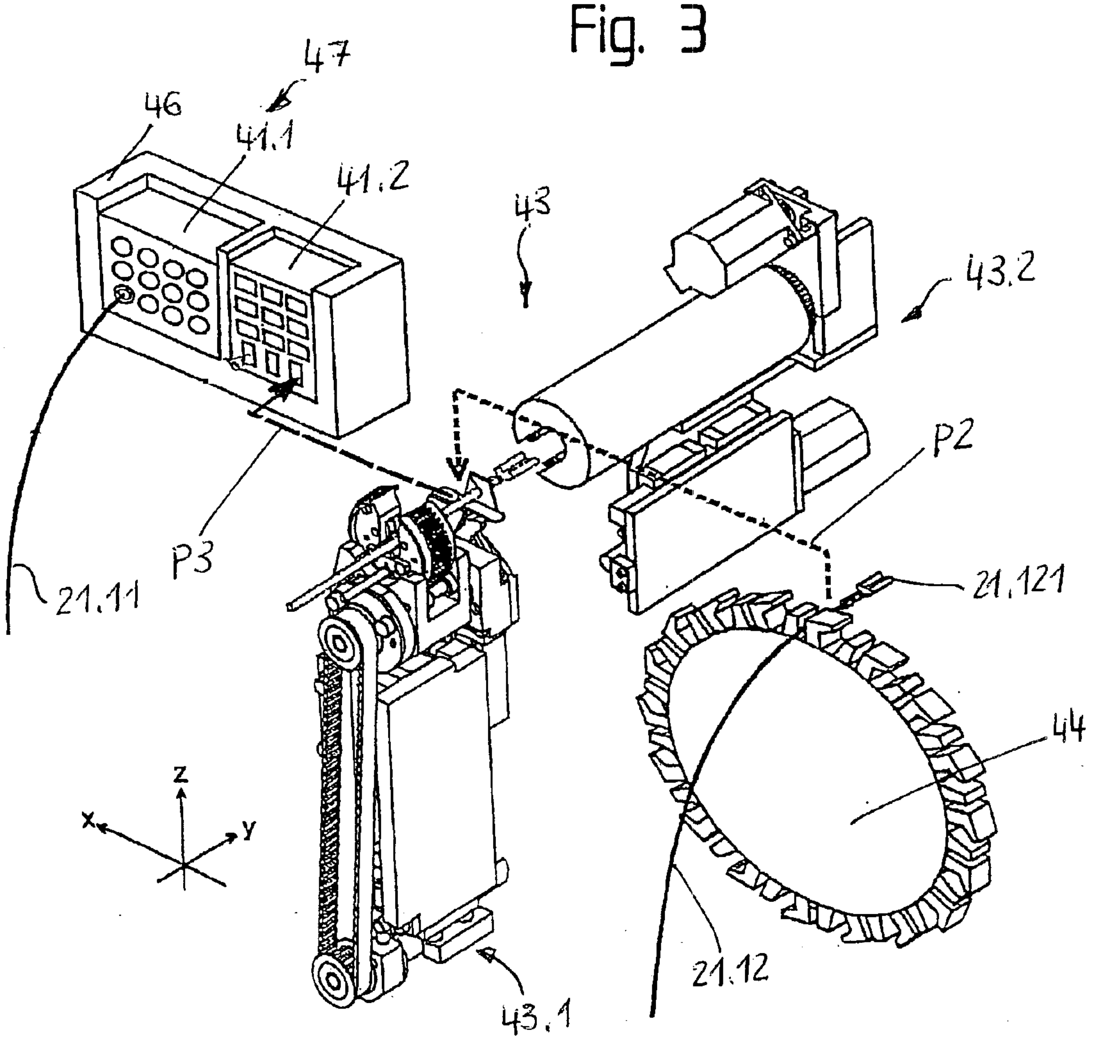
FIG. 3 illustrates the installation path for equipping the second housing with a pre-positioned cable end according to the cable plan shown in FIG. 2.

FIG. 3 shows the equipping of the first housing 41.1 and of the second housing 41.2 with the cable ends 21.11 and 21.12 respectively of the first cable loop 21.1. In the first housing 41.1 the leading cable end 21.11 of the first cable loop 21.1 is already equipped, wherein the trailing cable end 21.12 of the first cable loop 21.1 is stored in the store 44. After the left and center cells 48 of the lower row of the second housing 41.2 have been equipped with the trailing cable ends of the third and second cable loops (not shown), the feeder unit 42 then takes over the trailing cable end 21.12 of the second cable loop 21.1 from the store 44 and transfers it to the positioning unit 43. The movement of the feeder unit 42 in the Z direction and in the X direction is symbolized by an arrow P2. A turning unit 43.1 positions the cable lug 21.121 of the trailing cable end 21.12 on the basis of measurement data of a scanning unit 43.2 of the positioning unit 43. The equipping unit 45 takes over the trailing cable end 21.12 of the first cable loop 21.1 from the turning unit 43.1 and thus equips the corresponding cell 48 at the right end of the lower row of the second housing 41.2. The movement of the equipping unit 45 in the X direction and the Y direction is symbolized by an arrow P3.

Contacts crimped at the cable ends can twist up to 20° about the cable longitudinal axis on the way from the fitting-out units 24 to the housings 41.1 and 41.2 due to internal cable stresses and transfers from gripper to gripper. Twisted contacts make difficult or render impossible the equipping of the contact and lead to improperly equipped housings. The positioning unit 43 contactlessly measures the position of the contact and turns the contact into the desired position corresponding to the housing cell to be equipped. The positioning unit 43 consists of the turning unit 43.1 and the scanning unit 43.2, wherein the turning unit 43.1 brings the contact into the desired position on the basis of measurement data generated by the scanning unit 43.2.

Figure 4:
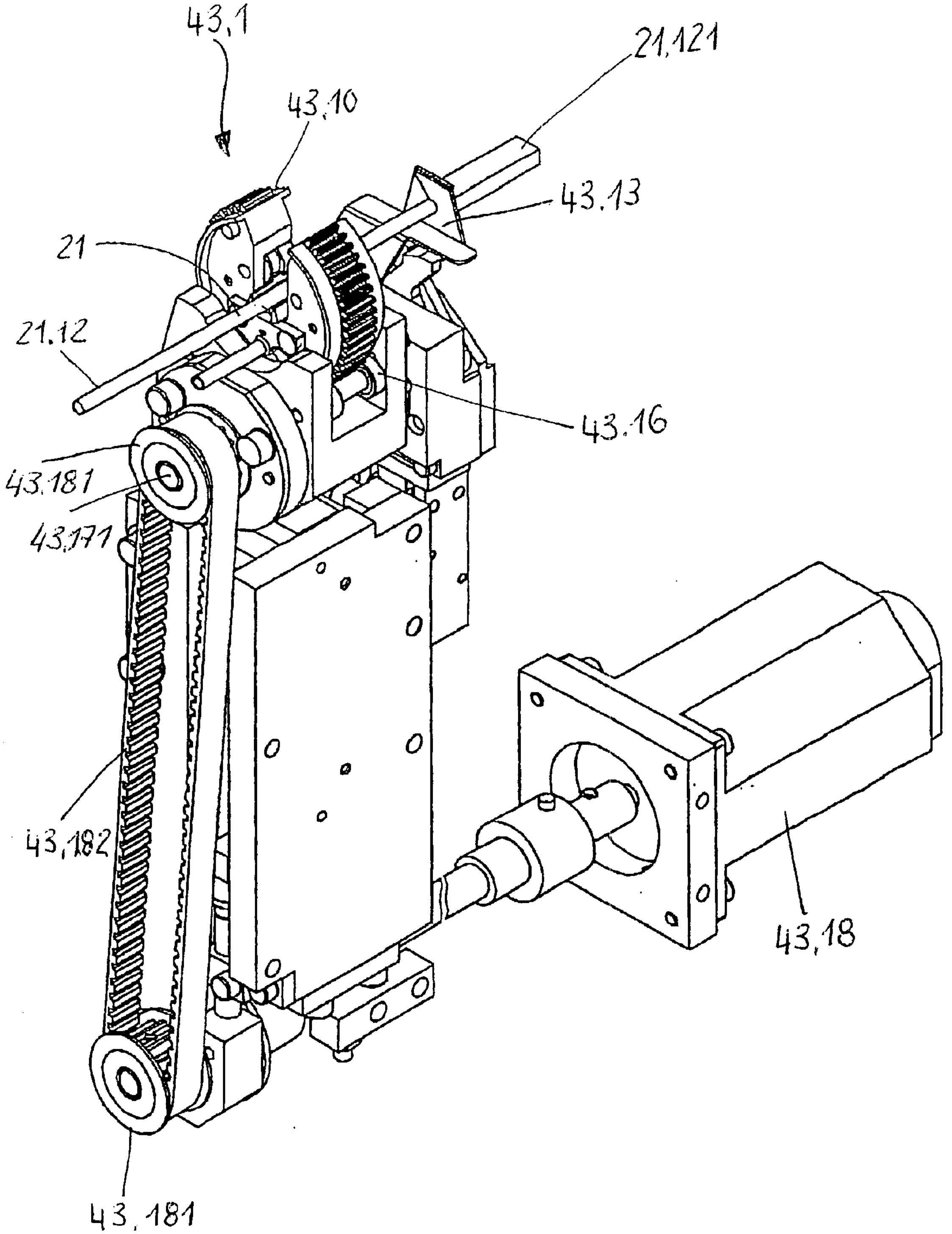
FIGS. 4 and 5 are perspective views of the turning unit for pre-positioning the cable end shown in FIG. 1.
Figure 5:
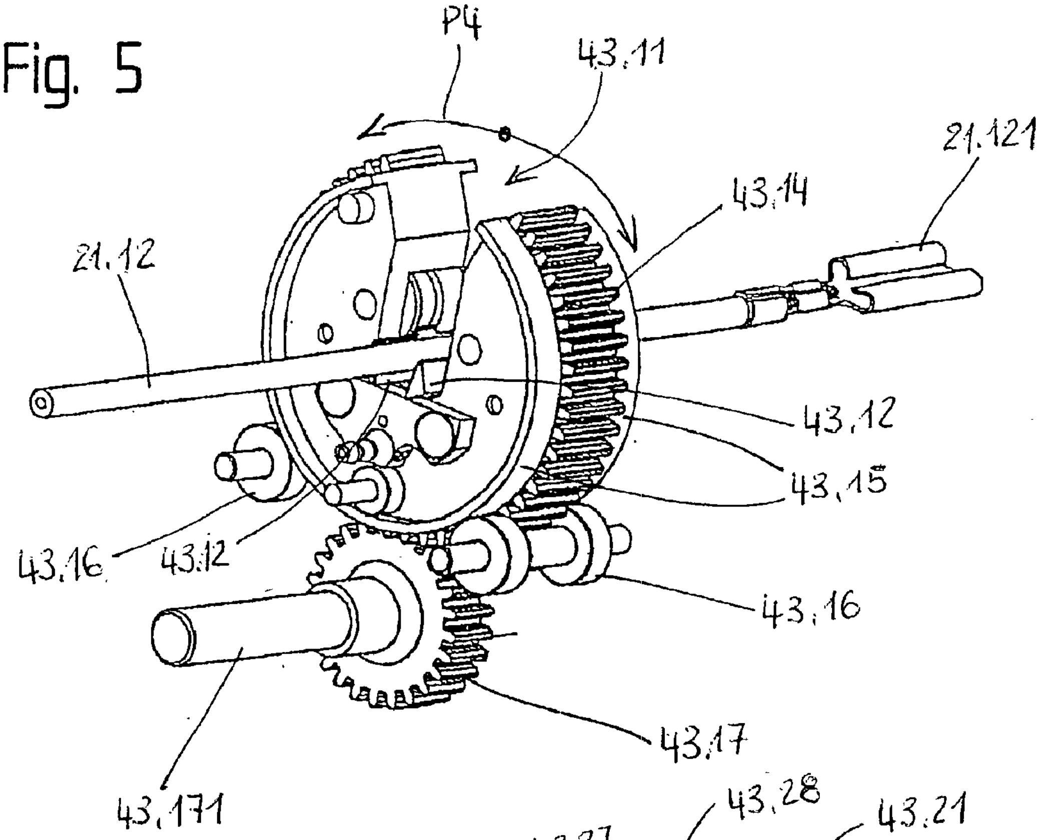

FIG. 4 and FIG. 5 show the turning unit 43.1 for positioning the contacts, which are arranged at the cable ends, such as, for example, the cable lugs 21.121 which are rectangular in cross-section. The turning unit 43.1 includes a drum 43.10 with an axially extending opening 43.11 through which the cable end 21.12 is insertable into the drum 43.10. Clamping grippers 43.12 are arranged in the drum 43.10 to firmly hold the cable end 21.12. A gripper 43.13 of the turning unit 43.1 holds the contact 21.121 spaced from the drum 43.10. A crown gear 43.14 is provided at the circumferential surface of the drum 43.10 and a respective guide surface 43.15 is provided at each crown gear side. Support rollers 43.16 support the drum 43.10 at the guide surfaces 43.15, wherein the drum 43.10 is drivable in rotation by means of a pinion 43.17. A drive 43.18 sets a pinion axle 43.171 into movement via pulleys 43.181 and a cogged belt 43.182, wherein the drum 43.10 executes the rotation symbolized by an arrow P4.

Figure 6:
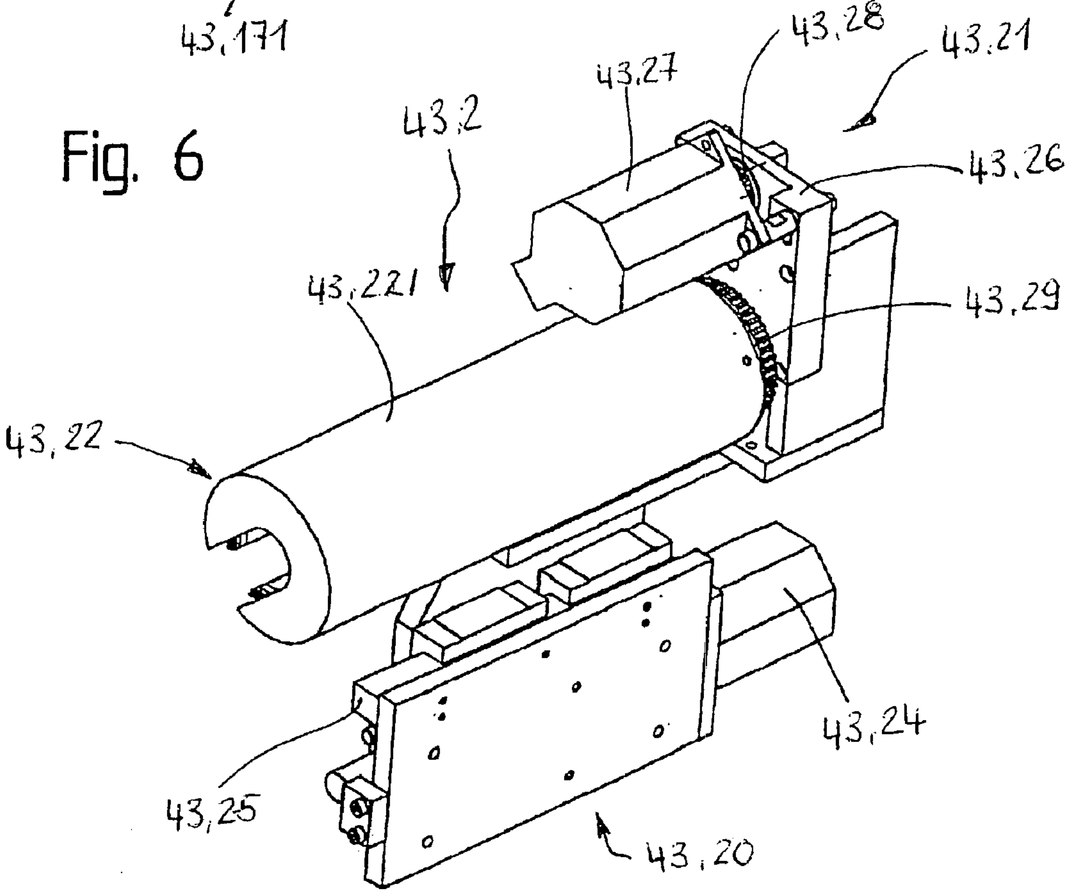
FIGS. 6 and 7 are perspective views of the scanning unit for establishing the contact position shown in FIG. 1.
Figure 7:
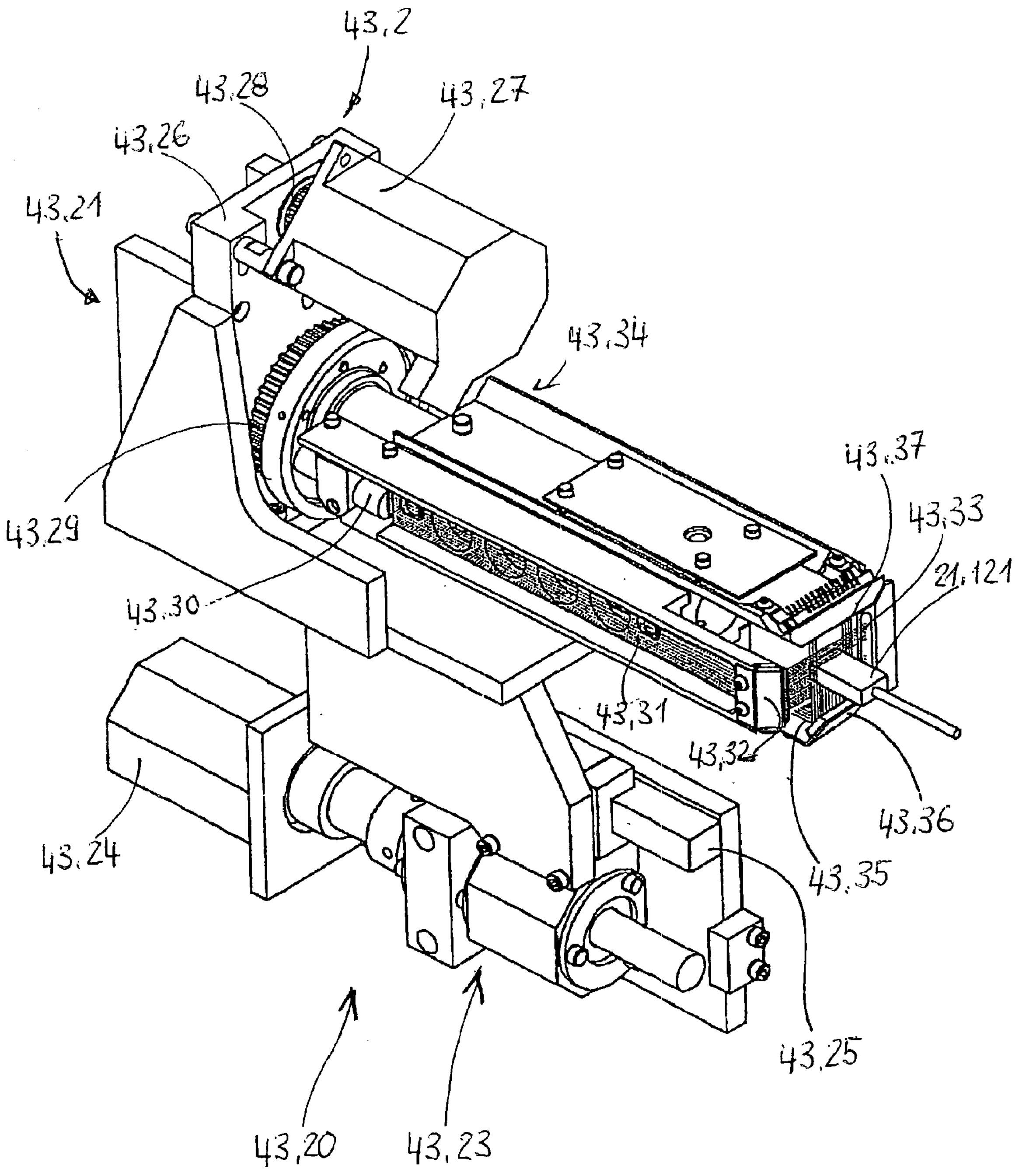

FIG. 6 and FIG. 7 show the scanning unit 43.2 for determining the position of the contact or for contactless measuring of the position of the contact 21.121. The scanning unit 43.2 includes a linear module 43.20 for movement of a turning module 43.21 with a measuring head 43.22 in cable axial direction, wherein a spindle drive 43.23 with a motor 43.24 moves the turning module 43.21 along a guide 43.25. The turning module 43.21 includes a base plate 43.26, at which a motor 43.27 is arranged, which acts on a crown gear 43.29 of the measuring head 43.22 via a pulley 43.28 and a cogged belt (not illustrated). The measuring head 43.22, with a length due to optical reasons, is rotatable in a clockwise sense and in anti-clockwise sense. The measuring head 43.22 is shown without a housing 43.221 in FIG. 7. A light source 43.30 operating, for example, on the laser principle generates a horizontally directed, upright (vertical) light curtain 43.31, which is deflected in the front region of the measuring head 43.22 by means of a mirror 43.32 and is measured by a linear CCD z module 43.33 (Charged Coupled Device) arranged opposite the mirror 43.32. A further light source 43.34 (not visible in FIG. 7, arranged at a 90° angle relative to the light source 43.30) operating on, for example, the laser principle generates a horizontally directed, lying (horizontal) light curtain 43.35, which is deflected into the vertical in the front region of the measuring head 43.22 by means of a mirror 43.36 and is measured by a linear CCD x module 43.37 (Charged Coupled Device) arranged opposite the mirror 43.36. The contact 21.121 is scanned in the front region of the measuring head 43.22 by the surfaces spanning the two light curtains 43.31 and 43.35 in that the silhouette of the contact 21.121 is detected in a horizontal direction and in a vertical direction. The measuring head 43.22 is rotated by means of the turning module 43.21 in steps about the cable axis, wherein the CCD modules 43.33 and 43.37 each measure the instantaneous shadow of the contact 21.121. The twist of the contact 21.121 can be ascertained from the overall silhouette. After the measuring cycle the twist is corrected by means of the turning unit 43.1. The length of the contact 21.121 can also be established by the movement of the linear module 43.20 (Y direction) on the basis of the thus-arising silhouette.

In the processing of one contact type, the position in the Y direction is established for the first contact of this contact type and stored, in which position the measurements of the silhouette in the X and Z directions are carried out.

Each of the CCD modules 43.33 and 43.37 measures the silhouette or the width of the shadow. The contours, the twist and the axes of the contact 21.121 and the deviations of the axes in the X and Z directions are determined from the width of the shadow and the rotational angle of the measuring head 43.22.

The simple construction and the thus achieved accuracy of the measurement result are advantageous in the case of the above-illustrated measuring method and in the case of the above-illustrated measuring equipment. Insensitivity to extraneous light, insensitivity to reflections, no lens focussing and short measuring times are further advantages. Moreover, long and thin objects can be measured, which is hardly possible by a frontal measuring.

The shadow measuring with the two light curtains 43.31 and 43.35 has the advantage that for ascertaining the silhouette the total angle of rotation of the measuring head 43.22 relative to shadow measuring with one light curtain can be halved and also to provide means to eventually correct the field optical distortions.

A measuring head with only one light curtain can also be used as a variant. The light curtain can also be deflected several times, which has the consequence of a shorter measuring head.

Figure 8:
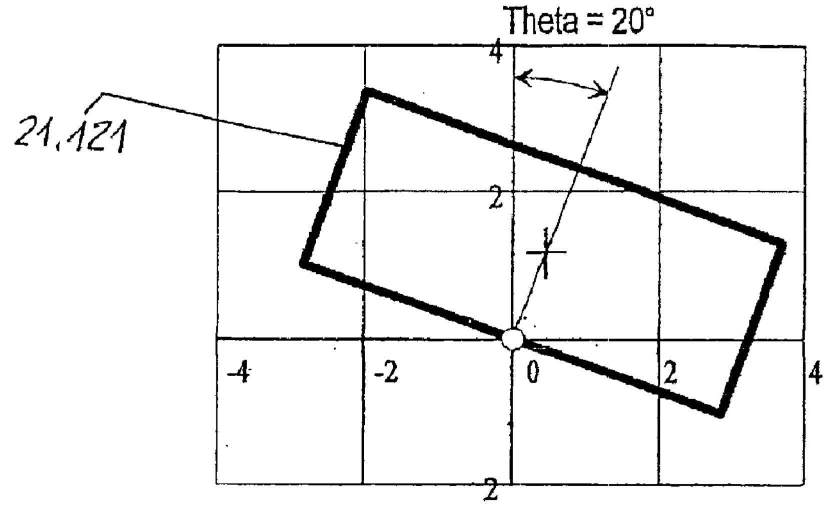
FIG. 8 is a schematic representation of the cable lug, which is firmly held by the gripper of the turning unit as shown in FIG. 5, with a twist.

FIG. 8 shows the cable lug 21.121 with a twist, the cable lug being firmly held by the gripper 43.13 of the turning unit 43.1 and being symbolized by a rectangle of, for example, 6 mm by 2.5 mm. The dimensional extent in the X direction is recorded on the abscissa and the dimensional extent in the Z direction is recorded on the ordinate. The cable lug 21.121 or contact lies by the edge at the fulcrum corresponding with the coordinate origin 0/0. The contact 21.121 is turned in clockwise sense about, for example, the angle theta of 20°. The center point of the rectangular is denoted by "+". In the case of the contact sleeve 21.111 with a round cross-section, positioning dogs or detent springs, for example, are of significance for the shadow measurement. Passages or holes are also recognizable.

Figure 9:
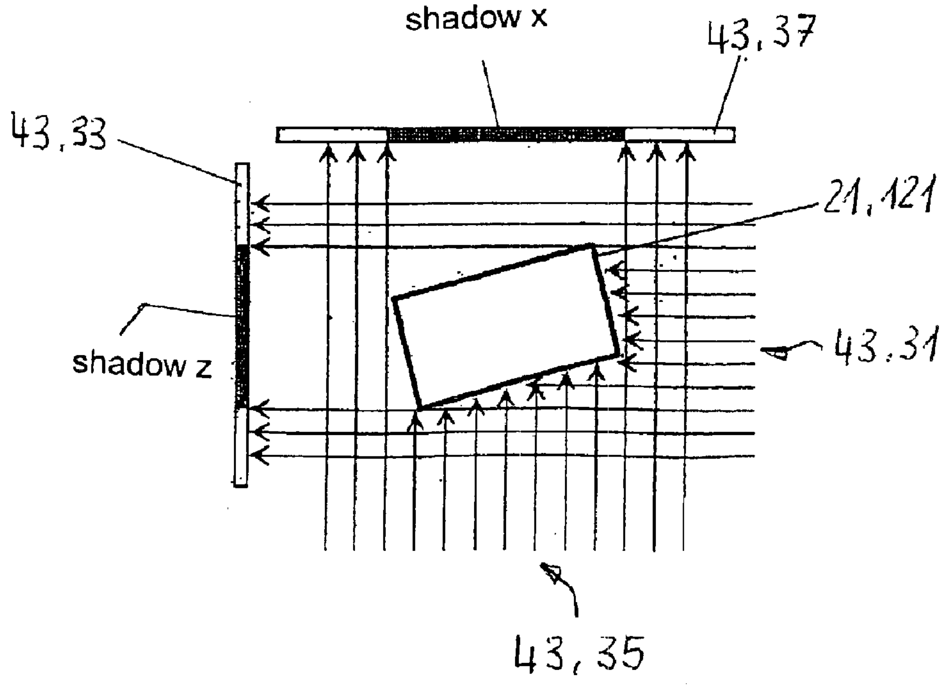
FIG. 9 is a schematic representation of the scanning unit of FIG. 7 establishing the contact position.

FIG. 9 shows the position, which is seen by the measuring head 43.22, of the light curtains 43.31 and 43.35 or the position of the CCD modules 43.33 and 43.37 in the first shadow measurement. The "shadow x" or "shadow z" caused by the contact 21.121 is illustrated as a dark area. The width of each of the "shadow x" and the "shadow z" and the rotational angle of the measuring head 43.22 are recorded at the instant of measuring. The measuring head 43.22 is then rotated in a counterclockwise sense by means of the turning module 43.21 through an angular increment of, for example, 2° and the width of each of the "shadow x" and the "shadow z" is measured again. The measuring steps are repeated until an unambiguous minimum width of the "shadow x" or of the "shadow z" can be established.

Figure 10:
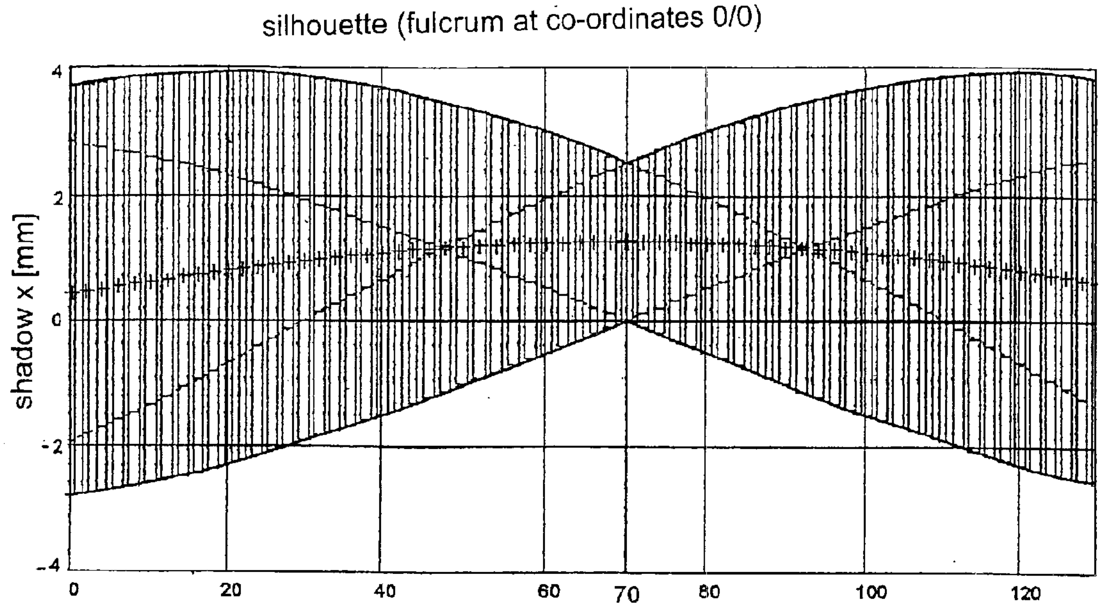
FIGS. 10 and 11 are plots of the silhouette, which is formed from a shadow width and rotary angle of the scanning unit, of the contact with a twist shown in FIG. 8.
Figure 11:
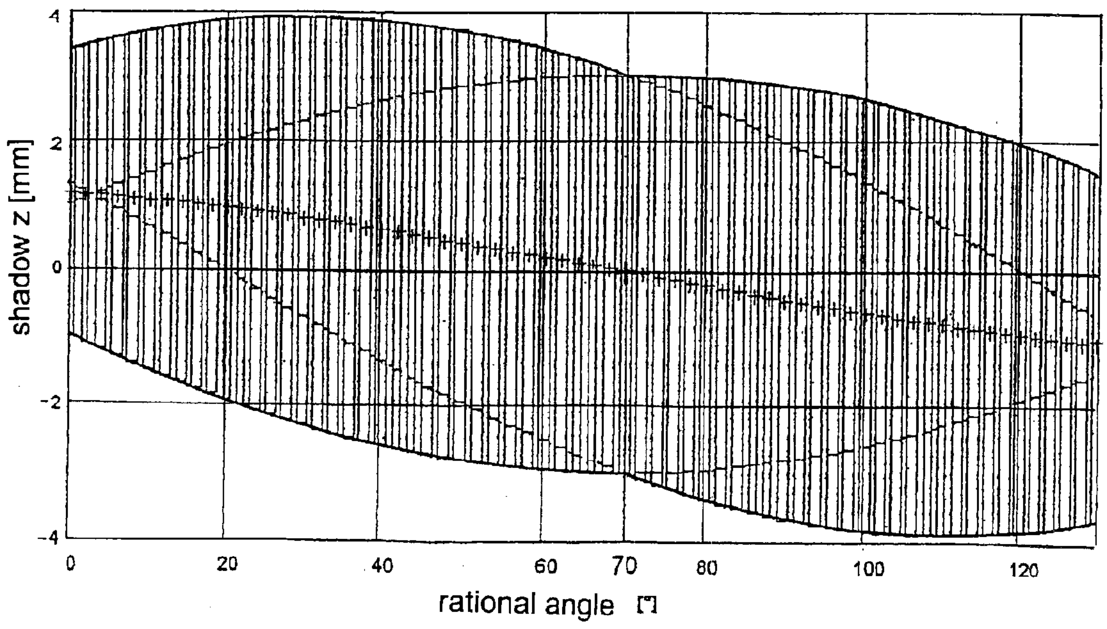

FIG. 10 and FIG. 11 show the silhouette, which is formed from the shadow width and rotational angle of the scanning unit, of the contact with a twist. The rotational angle is recorded on the abscissa and the shadow width is recorded on the ordinate. FIG. 10 shows the silhouette of the "shadow x" as a function of the rotational angle of the measuring head 43.22 or of the CCD module x 43.37 with a shadow measurement at each 2° (increment) of the rotational angle. FIG. 11 shows the silhouette of the "shadow z" as a function of the rotational angle of the measuring head 43.22 or of the CCD module z 43.33 with a shadow measuring at each 2° of the rotational angle and the two light curtains 43.31 and 43.35. A minimum of the shadow width occurs at a rotational angle of 70°. The minimum can also be determined from the slope of the tangents at the envelope curve. A minimum has occurred at a change in sign of the tangent slope. The associated rotational angle corresponds with the twist (angle theta of 20°) of the contact 21.121, wherein the rotational angle is passed on to the turning unit 43.1. The turning unit 43.1 rotates the contact 21.121 through 20° in a counterclockwise sense as seen from the turning unit 43.1. Thereafter the contact 21.121 is in the equipping position and ready for take over by the equipping unit 45.

Figure 12:
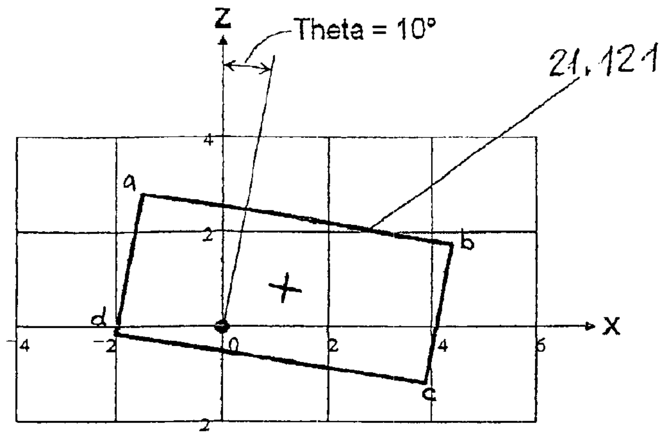
FIG. 12 is schematic representation of the cable lug, which is firmly held by the gripper of the turning unit as shown in FIG. 5, with a twist and a displacement.

FIG. 12 shows the contact 21.121 with a twist of theta=10° and a displacement of delta x=−2 and delta z=−0.5 measured from the fulcrum or co-ordinate center point 0/0. The dimensions of the rectangle (contact 21.121) correspond with those of FIG. 8.

Figure 13:
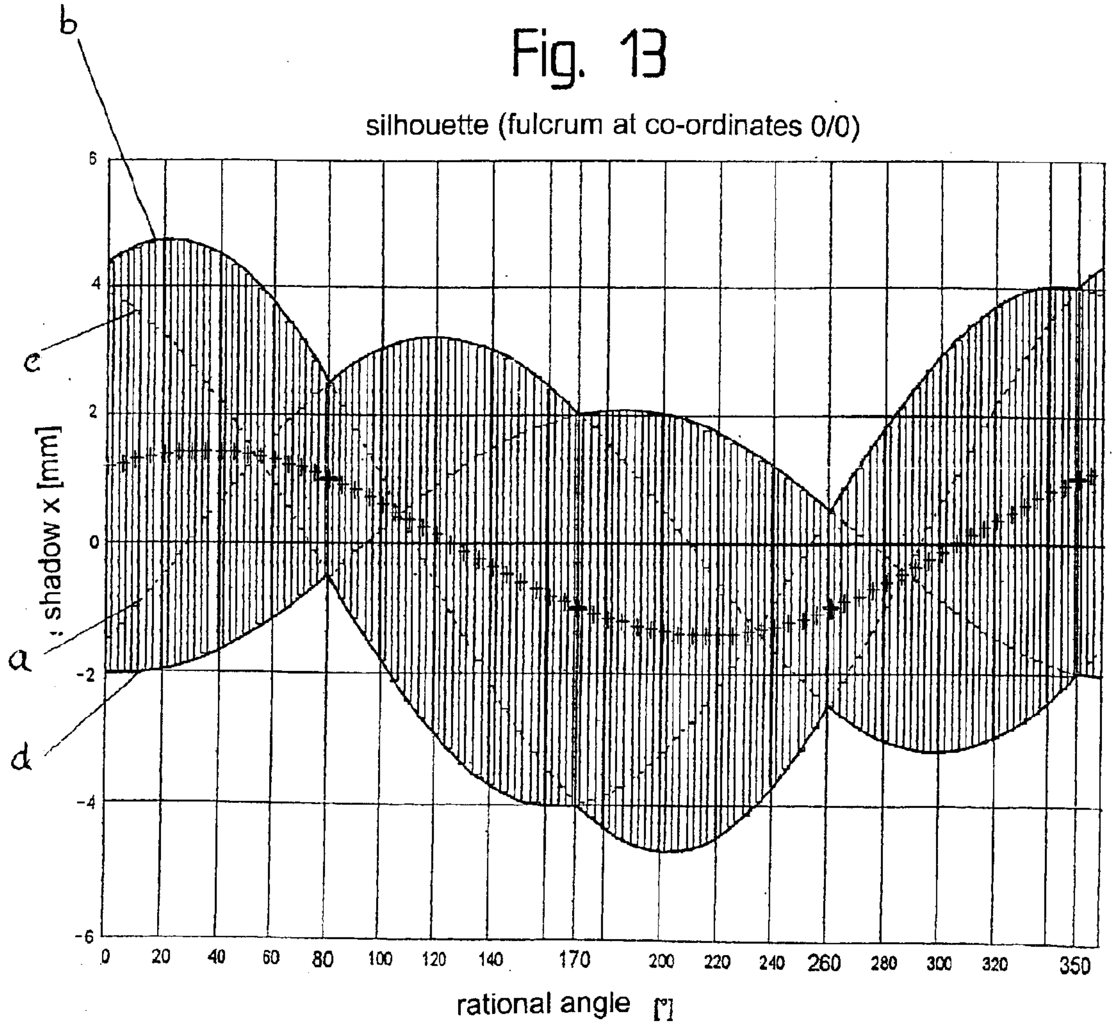
FIG. 13 is a plot of the silhouette, which is formed from a shadow width and rotary angle of the scanning unit, of the contact with a twist and a displacement shown in FIG. 12.

FIG. 13 shows the silhouette of the "shadow x" (contact 21.121 of FIG. 12) for a measurement at each 5° of the rotational angle and a total rotational angle of the measuring head 43.22 of 360°. A total rotational angle of 180° is necessary for shadow measurement by the one light curtain 43.35. The silhouette of the "shadow z" is not illustrated. The shape of the silhouette of the "shadow z" corresponds with the shape of the silhouette of the "shadow x". The silhouette of the "shadow z" is, however, displaced on the abscissa by 90° relative to the silhouette of the "shadow x". FIG. 13 shows four minima of the width of the "shadow x" at a rotational angle of 80°, 170°, 260° and 350°. A total rotational angle of at least 180° is necessary for determination of the twist and the displacement of the contact 21.121 according to FIG. 12 with one light curtain ("shadow x"), thus detection of two minima of the width of the "shadow x". A total rotational angle of at least 90° is necessary for determination of the twist and the displacement of the contact 21.121 according to FIG. 12 with two light curtains ("shadow x" and "shadow z"), thus detection of one minimum of the width of the "shadow x" and detection of one minimum of the width of the "shadow z". The twist (angle theta of 10°) of the contact 21.121 can be derived from the rotational angle at the minimum and passed on to the turning unit 43.1. The turning unit 43.1 rotates the contact 21.121 through 10° in a counterclockwise sense as seen from the turning unit 43.1. The contact 21.121 is thereafter in the equipping position and ready for take over by the equipping unit 45. The equipping unit 45 takes into consideration the displacement of delta x=−2 and delta z=−0.5, which can derived from the shadow measurements, in the equipping of the contact 21.121. The displacements can also be taken into consideration by the housing pallet 47. The displacements can also be taken into consideration in one direction of the equipping unit 45 and in the other direction of the housing part 47 or conversely.

The corners of the rectangle or contact 21.121 are denoted by "a", "b", "c" and "d" and the center point by "+" in FIG. 12. The images of these points on the CCD module 43.37 (spacing of the respective point from the zero point of the CCD module) give, as a function of the rotational angle, the curves "a", "b", "c", "d" and "+" illustrated in FIG. 13.

The measuring head 43.22 can also measure the position of the contact 21.121 in the Y direction by the light curtains 43.31 and 43.35 and by the CCD modules 43.33 and 43.37. The linear module 43.20 moves the turning module 43.21 together with the measuring head 43.22 on the contact 21.121 until the CCD modules 43.33 and 43.37 see the shadows of the contact 21.121. The thus-established position of the contact 21.121 is passed on to the equipping unit 45, which takes into consideration the position of the contact 21.121 in the Y direction during the equipping.

Figure 13A:
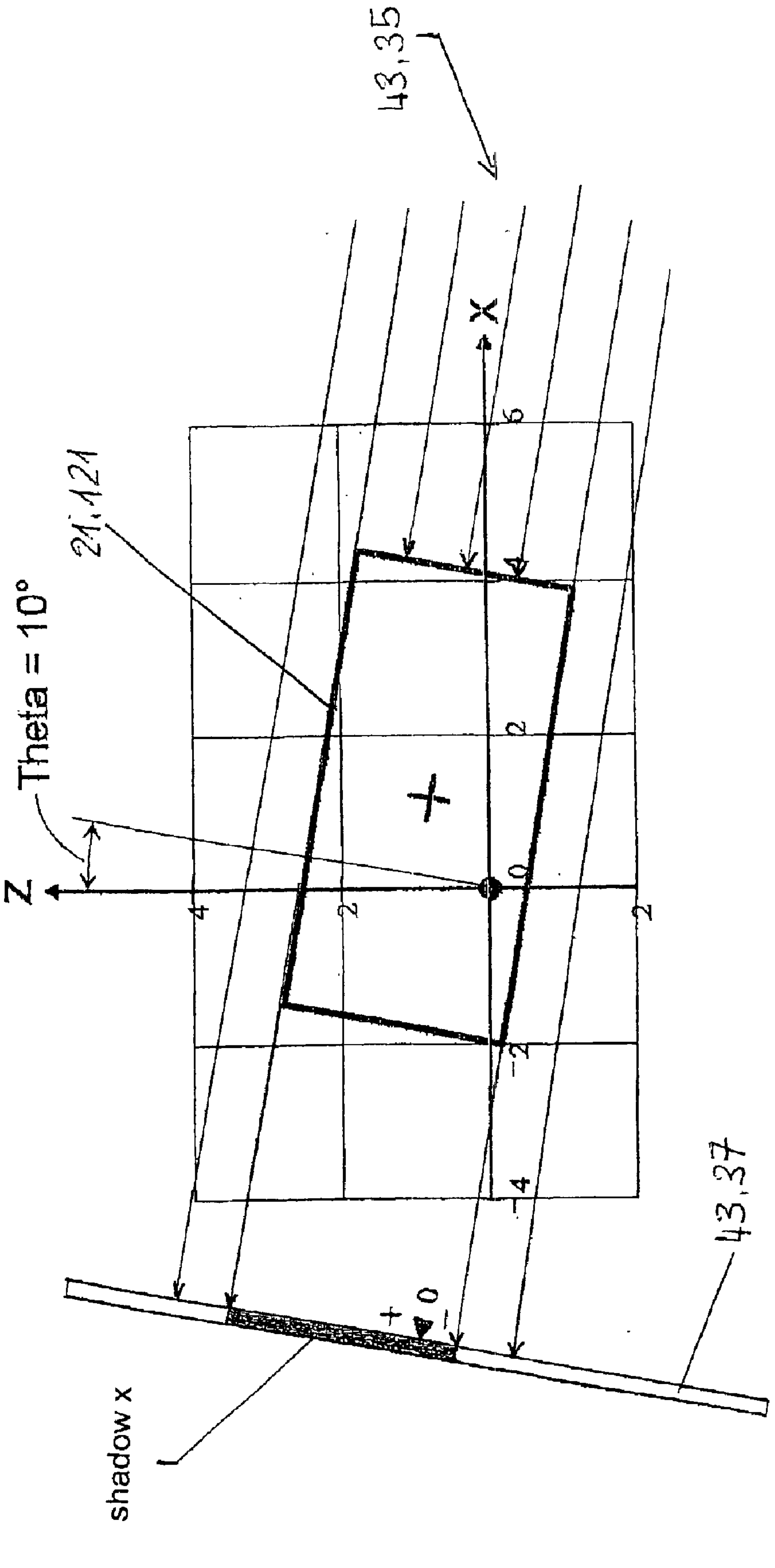
FIG. 13*a* is a schematic representation of the shadow width of the cable lug in the case of a specific angle of rotation of the scanning unit for determining the displacement.

FIG. 13*a* shows the shadow width of the "shadow x" at a rotational angle of 80° of the measuring head 43.22 for determination of the displacement of the contact 21.121 with the twist and the displacement according to FIG. 12. The shadow width in the negative region corresponds with the displacement delta z and can be established from the silhouette of FIG. 13 at the first minimum (80° rotational angle) from the zero line in negative direction up to the minimum.

Figure 13B:
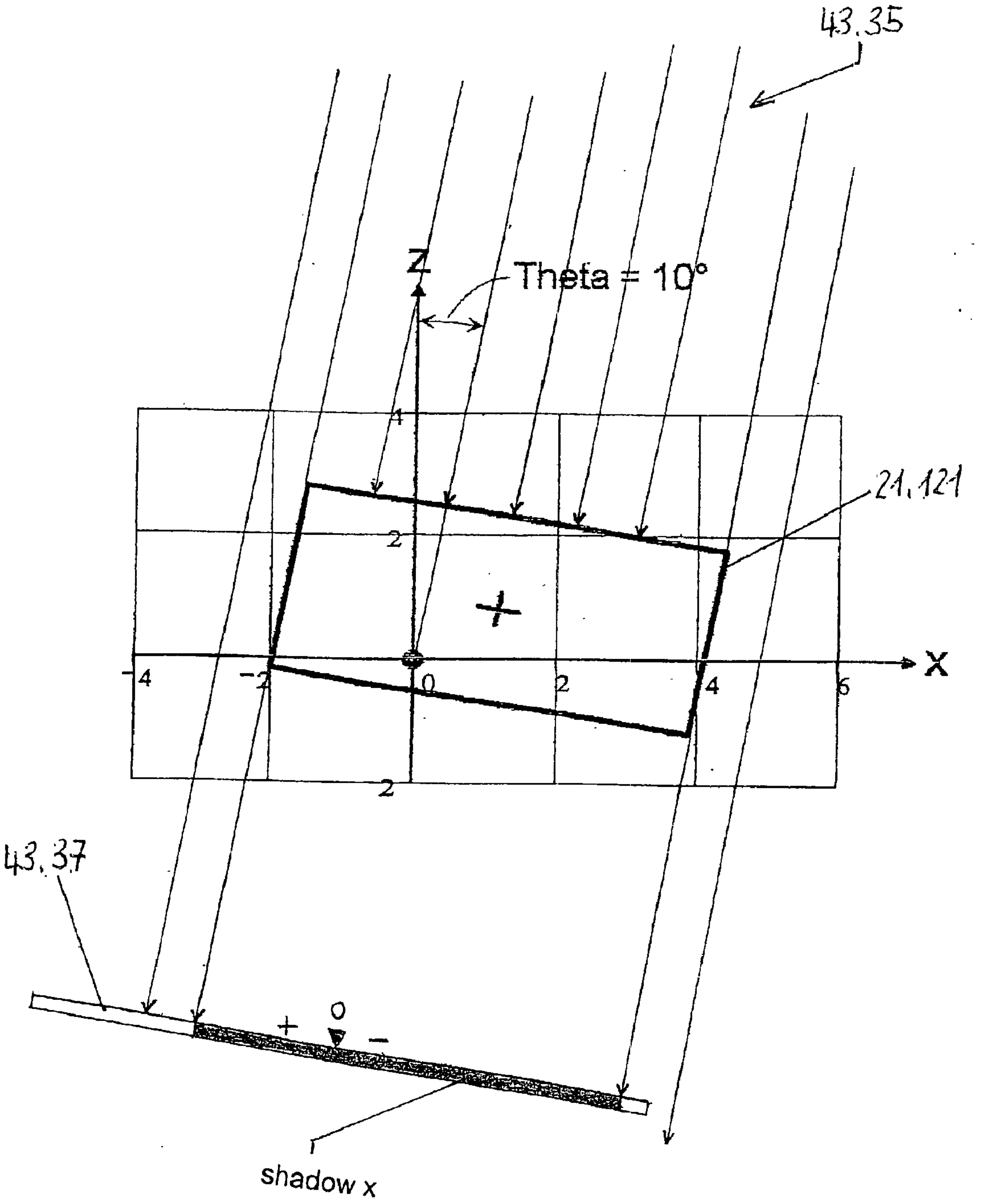
FIG. 13*b* is a schematic representation of the shadow width of the cable lug in the case of a further angle of rotation of the scanning unit for determining the displacement.

FIG. 13*b* shows the shadow width of the "shadow x" at a rotational angle of 170° of the measuring head 43.22 for determination of the displacement of the contact 21.121 with the twist and the displacement according to FIG. 12. The sum of the shadow width in the positive region and the shadow width in the negative region gives delta x. The displacement in the X direction can also be read from the silhouette of FIG. 13. At the second minimum (170° rotational angle) the shadow width extends in a positive direction from the zero line to the minimum and in a negative direction from the zero line to the minimum. The sum of the two (partial) shadow widths gives delta x.

Figure 14A:
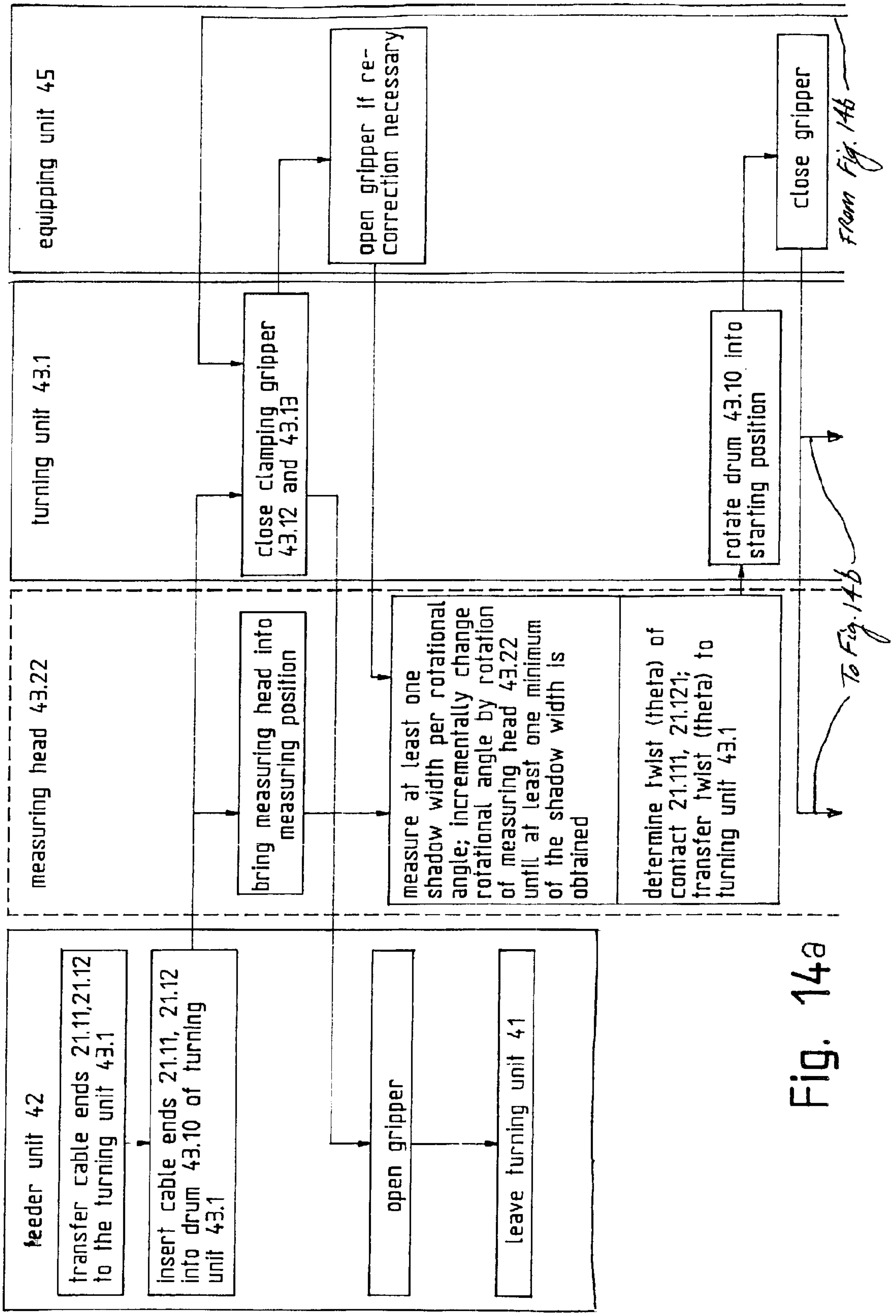
FIGS. 14*a* and 14*b* are flow diagrams illustrating the co-operation between the feeder unit, the scanning unit, the turning unit and the equipping unit shown in FIG. 1.
Figure 14B:
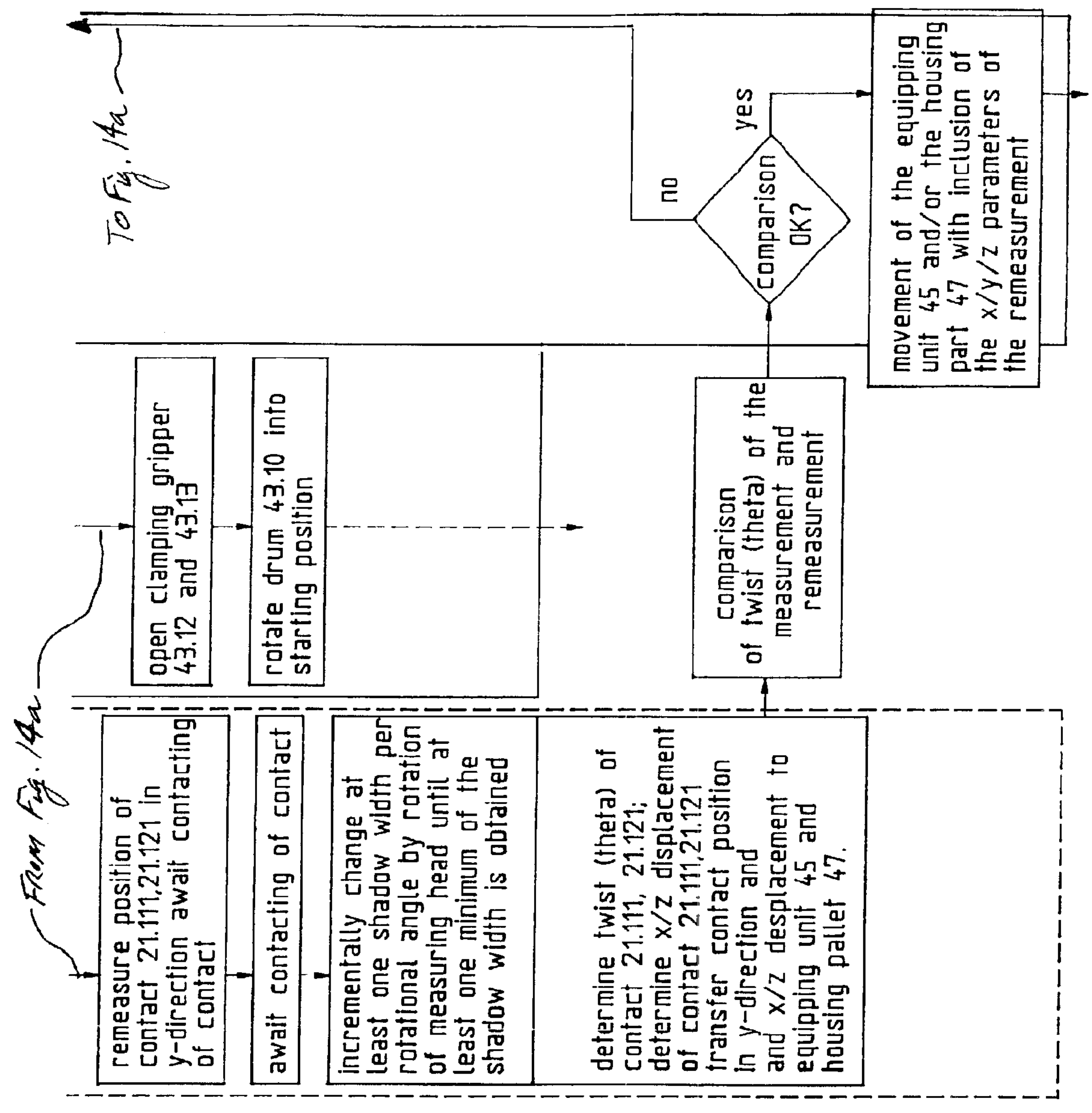

FIG. 14 is a flow diagram of the method of operation according to the present invention illustrating the co-operation between the feeder unit 42, the scanning unit 43.2, the turning unit 43.1 and the equipping unit 45. The feeder unit 42 transfers the cable ends 21.11 and 21.12 to the turning unit 43.1. Thereafter, the scanning unit 43.2 measures and determines the twist of the contacts 21.111 and 21.121. The twist is transferred to the turning unit 43.1, which corrects the angular position of the contacts 21.111 and 21.121 on the basis of the twist. Thereafter, the equipping unit 45 takes over the contact 21.111 and 21.121. After the take-over, the twist theta of each of the contacts 21.111 and 21.121 is remeasured by the scanning unit 43.2 and the displacement in X direction and the Z direction and the position of the contact in the Y direction are determined. In the case of deviations, each of the contacts 21.111 and 21.121 is transferred again to the turning unit 43.1 and the measuring and correcting process begins anew. The x/y/z parameters are taken into consideration by the equipping unit 45 and/or by the housing part 47.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A method of equipping plug housings with fitted-out cable ends of a cable, wherein an equipping unit introduces the cable ends into cells of a corresponding plug housing, comprising the steps of:

a. detecting an actual position of each contact arranged at a cable end the actual position representing a twist of the contact about a longitudinal axis of the cable; and b. rotating the contact about the longitudinal axis from the actual position to a desired position corresponding to a housing cell to be equipped with the contact.

2. The method according to claim 1 including a step of generating a silhouette from a shadow width of the contact utilizing a scanning unit and wherein said step a. includes using a rotational angle of the scanning unit as a representation of the actual position of the contact.

3. The method according to claim 2 wherein said step a. is performed by detecting at least one shadow width per rotational angle, wherein the rotational angle is incrementally varied by rotation of a measuring head of the scanning unit until at least one minimum of the shadow width is reached.

4. The method according to claim 1 wherein said step a. is performed by determining a displacement of the contact in an X direction and a Z direction from a silhouette of the contact and determining a twist angle of the contact from a minimum width of the silhouette.

5. A method of equipping plug housings with fitted-out cable ends of a cable, wherein an equipping unit introduces the cable ends into cells of a corresponding plug housing, comprising the steps of:

a. generating a silhouette from a shadow width of a contact arranged at a cable end utilizing a scanning unit;

b. detecting an actual position of the contact using a rotational angle of the scanning unit as a representation of the actual position of the contact, the scanning unit detecting at least one shadow width per the rotational angle, wherein the rotational angle is incrementally varied by rotation of a measuring head of the scanning unit until at least one minimum of the shadow width is reached; and c. rotating the contact from the actual position to a desired position corresponding to a housing cell to be equipped with the contact.

6. A method of equipping plug housings with fitted-out cable ends of a cable, wherein an equipping unit introduces the cable ends into cells of a corresponding plug housing, comprising the steps of:

a. holding a contact arranged at a cable end;

b. scanning the contact to determine an actual position representing a twist of the contact about a longitudinal axis of the cable; and c. rotating the contact about the longitudinal axis from the actual position to a desired position corresponding to a housing cell to be equipped with the contact.

7. The method according to claim 6 including a step of generating a silhouette from a shadow width of the contact utilizing a scanning unit and wherein said step b. includes using a rotational angle of the scanning unit as a representation of the actual position of the contact.

8. The method according to claim 7 wherein said step b. is performed by detecting at least one shadow width per rotational angle, wherein the rotational angle is incrementally varied by rotation of a measuring head of the scanning unit until at least one minimum of the shadow width is reached.

9. The method according to claim 6 wherein said step b. is performed by determining a displacement of the contact in an X direction and a Z direction from a silhouette of the contact and determining a twist angle of the contact from a minimum width of the silhouette.

* * * * *